United States Patent [19]

Wickersham et al.

[11] 4,414,085
[45] Nov. 8, 1983

[54] METHOD OF DEPOSITING A HIGH-EMISSIVITY LAYER

[75] Inventors: Charles E. Wickersham, Columbus; Ellis L. Foster, Powell, both of Ohio

[73] Assignee: The United States of America as represented by the U.S. Department of Energy, Washington, D.C.

[21] Appl. No.: 309,656

[22] Filed: Oct. 8, 1981

[51] Int. Cl.³ .............................................. C23C 15/00
[52] U.S. Cl. ............................. 204/192 C; 204/192 P
[58] Field of Search .......... 204/192 C, 192 SP, 192 P, 204/192 EC

[56] References Cited

U.S. PATENT DOCUMENTS 3,709,809 1/1973 Wright et al. .................. 204/192 C
4,309,261 1/1982 Harding et al. ................. 204/192 R

OTHER PUBLICATIONS

J. E. Sundgren, . . . Reactively R.F. Sputtered TiC Films, *Thin Solid Films*, 80 (1981), pp. 77–83.
G. L. Harding et al., Magnetron–Sputtered Metal Carbide Solar Selective Absorbing Surfacer, *J. Vac. Sci. Technol.*, 16 (3), May/Jun. 1979, pp. 857–862.
G. L. Harding, . . . Metal Carbide Selective Surfaces . . ., *Solar Energy Materials*, 2 (1980), pp. 469–481.
C. E. Wickersham et al., Reactively Sputter Deposited High-Emissivity Tungsten/Carbon Coatings, *J. Vac. Sci. Technol.* 18 (2), Mar. 1981, pp. 223–225.

*Primary Examiner*—Howard S. Williams
*Assistant Examiner*—William Leader
*Attorney, Agent, or Firm*—Sandra Weiss; John M. Albrecht; Richard G. Besha

[57] ABSTRACT

A method of depositing a high-emissivity layer on a substrate comprising RF sputter deposition of a carbide-containing target in an atmosphere of a hydrocarbon gas and a noble gas. As the carbide is deposited on the substrate the hydrocarbon gas decomposes to hydrogen and carbon. The carbon deposits on the target and substrate causing a carbide/carbon composition gradient to form on the substrate. At a sufficiently high partial pressure of hydrocarbon gas, a film of high-emissivity pure carbon will eventually form over the substrate.

8 Claims, 4 Drawing Figures

METHOD OF DEPOSITING A HIGH-EMISSIVITY LAYER

CONTRACTUAL ORIGIN OF THE INVENTION

The U.S. Government has rights in this invention pursuant to Contract No. W-7405-ENG-92 between the U.S. Government and Battelle Columbus Laboratories.

BACKGROUND OF THE INVENTION

This invention relates to a method of depositing a high-emissivity carbon coating on a substrate by reactive RF sputtering. More specifically, the invention relates to a method of depositing a carbide-carbon coating on a substrate by reactive RF sputtering having a composition gradient such that the coating is composed primarily of a carbide compound near the substrate and primarily of carbon near the exterior surface.

Thermoelectric generators are frequently used as an energy source in aerospace applications. Temperature regulation in these generators is a critical problem for both orbital satellites and deep space probes. A high-emissivity coating on the metallic thermoelectric generator casings would improve the performance of satellite thermoelectric systems by radiating large quantities of heat while operating at low temperatures. The high-emissivity coating must be capable of withstanding the stresses imposed during launch and the elevated temperatures and vacuum conditions encountered during operation.

Carbon has many of these properties and would serve well as a high-emissivity coating. However, carbon does not adhere well to the metals often used in thermoelectric generator casings, namely iridium and aluminum. Attempts have been made to blend carbon with an epoxy and paint the mixture onto the casings, but this process adds undesirable weight to the generator. A more promising method is to sputter deposit a coating with a composition gradient such that the surface of the coating near the substrate is rich in material that adheres well to the substrate while the exterior surface of the coating is rich in carbon. Previous methods of deposition have involved rotating a substrate between two targets of different materials and gradually changing the deposition parameters on the two targets to obtain the desired composition gradient. This method is too complicated to be practical for the massive parts of the generator which must be coated.

SUMMARY OF THE INVENTION

It is thus one object of the invention to provide a method for depositing a carbon coating on a substrate by reactive RF sputter deposition.

It is another object of the invention to provide a method for depositing a carbide/carbon coating with a composition gradient on a substrate by reactive RF sputter deposition.

It is another object of the invention to provide a method for depositing a carbon coating on a substrate by reactive RF sputter deposition suitable for thermoelectric generators in aerospace applications.

Additional objects, advantages and novel features of the invention will be set forth in part in the following description.

In accordance with the invention, the method comprises providing a deposition chamber, a target fabricated from a carbide compound, and a substrate, positioning the target and substrate within the chamber, providing a noble gas and a hydrocarbon gas such as acetylene to the chamber, and applying RF power to the target to sputter deposit a film of the carbide compound onto the substrate. As sputter deposition proceeds, the hydrocarbon gas decomposes, depositing elemental carbon on the hot substrate and target. A carbide/carbon composition gradient develops through the film on the substrate such that the film is richer in carbide compound near the substrate and richer in carbon near the exterior surface. As more carbon is deposited onto the target, less carbide compound sputters onto the substrate. Once a continuous layer of carbon is formed on the target surface, the carbide compound deposition onto the substrate ceases, and a pure layer of carbon deposits over the carbide/carbon gradient on the substrate. The carbide interface between the substrate and the outer carbon layer provides an effective bonding mechanism between these normally non-adherent materials.

Coatings prepared in the manner described above have high thermal and vacuum stability. Radiant emissivity is high as long as the coatings are sufficiently thick. When the coatings are extremely thin the outer carbon layer may interdiffuse with the substrate to reduce emissivity. With slightly thicker coatings the carbide compound interface inhibits this interdiffusion and high emissivity is attained.

DETAILED DESCRIPTION OF THE PREFERRED EMBODIMENT

The following is detailed description of the preferred embodiment of the instant invention; other embodiments will be readily apparent to those skilled in the art.

Figure 1:
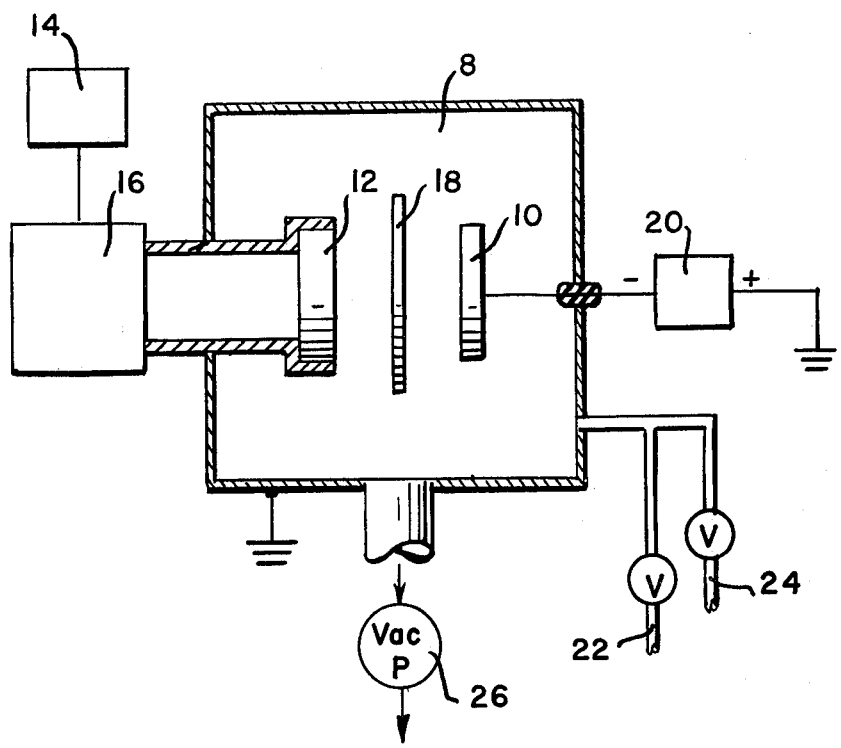
FIG. 1 is a schematic diagram of a typical RF sputtering apparatus.

FIG. 1 illustrates a standard RF sputtering apparatus of the type well known in the art. The sputtering chamber 8 is provided with a substrate 10 and a target 12. RF power at 13.56 MHz is supplied by a power source 14 to the target 12, producing a plasma and causing the target 12 to sputter. The device 16 is a matching network consisting mainly of capacitors and inductors which matches the impedance of the RF power source 14 to the plasma. The shutter 18 is a movable plate typically of stainless steel used to protect the substrate 10 from unwanted deposition while initial adjustments are made. The substrate 10 is connected to a device 20 which provides a DC bias of $-100$ V to $-1000$ V with respect to ground. The device 20 may also be used to sputter clean the substrate 10. Gas inlets 22 and 24 are used to maintain the desired flow of noble gas and hydrocarbon gas. Excess gases are removed from the sputtering chamber 8 through vacuum pumps 26.

In accordance with the invention, the substrate 10 may be a metal, such as iridium or aluminum, or a carbon/carbon composite, which is a structure of woven carbon fibers with elemental carbon deposited thereon. The iridium and carbon/carbon substrates may be about 0.0635 and 0.25 cm thick, respectively, and about 1 cm in diameter. The target 12 is generally a refractory metal carbide such as tungsten carbide or any carbide of the group IVB—VIB metals of the periodic table. Silicon carbide and boron carbide may also be used. A typical sputtering target 12 is water-cooled, cobalt-cemented tungsten carbide with a diameter of about 5 cm. The materials for the target 12 and substrate 10 should be sufficiently compatible such that the target 12 is at least slightly soluble in the substrate 10.

The target 12 and substrate 10 are inserted into the chamber 8 and positioned about 5 cm apart. The substrate 10 is sputter cleaned in an argon atmosphere for about 10 minutes. After cleaning is complete, a flow of acetylene is established in the chamber 8 to the desired partial pressure and a concurrent flow of argon is established such that the total pressure in the chamber 8 is about 3.33 Pa. When the gas flow is stable, about 25 watts/cm$^2$ of RF power is supplied from the source 14 to the target 12 whereby sputter deposition of the target material on the substrate 10 is initiated. A target bias voltage of about $-2800$ V appears between the target and ground during film deposition.

As sputtering proceeds, the substrate 10 and target 12 are under constant bombardment by ions and electrons and their temperatures increase. The presence of acetylene in the plasma tends to increase the electron flux impinging on the substrate and raises the steady state substrate temperature. Thus, when no acetylene is used the substrate temperature reaches 653 K., but when the partial pressure of acetylene is 0.066 Pa the substrate temperature is 713 K.

Deposited films are generally 0.2–10 $\mu$m thick. The accumulation rate of material on the substrate 10 varies with the partial pressure of acetylene; the accumulation rate increases from 260 to 600 Å/min as the acetylene partial pressure increases from 0 to 0.133 Pa. Depositions generally continue for at least twenty minutes and usually longer.

Films made according to the instant method have been found to be thermally stable after annealing in a vacuum of approximately $10^{-4}$ Pa at 1775 K. for 19 hours. Films subjected to this annealing show no change in emissivity as long as the film thickness is greater than 0.2 $\mu$m. With thinner films, the carbon interdiffuses with the substrate causing a decrease in emissivity.

Emissivity measurements were made using standard techniques well known in the art. The samples to be measured are assumed to be "grey" bodies, and the emissivity is given by the ratio of the "grey" body radiative emission to the radiation emitted by a blackbody. The blackbody radiation source was of the type standard in the art, as was the emission detector. Radiative emission was detected in the spectral range of 3 to 5 $\mu$m. All measurements were made with the blackbody source and sample at approximately 366 K.

Figure 2:
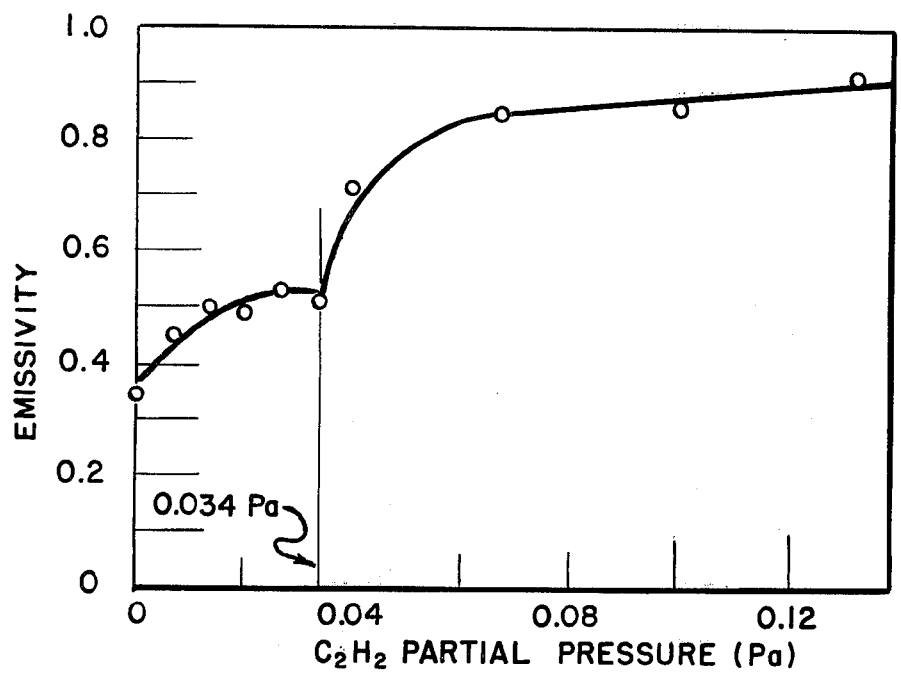
FIG. 2 is a graph of coating emissivity measured as a function of the partial pressure of acetylene during deposition.

FIG. 2 shows the emissivity of the film as a function of the partial pressure of acetylene during deposition. For these samples the power density was 24.7 watts/cm$^2$ and the total sputtering pressure, i.e., the sum of the partial pressures of argon and acetylene, was 3.33 Pa. The Figure shows that as the acetylene partial pressure is increased from 0 to 0.034 Pa, the emissivity increases gradually from 0.35 to 0.5. As the acetylene partial pressure is increased 0.034 to 0.07 Pa, the measured emissivity jumps from 0.5 to 0.85. As the acetylene partial pressure is increased past 0.07 Pa, the emissivity increases gradually from 0.85 to 0.91.

The unusual behavior of the curve when the partial pressure of acetylene is 0.034 Pa may be explained as follows. As sputtering deposition proceeds, the temperatures of the substrate 10 and the target 12 increase due to the ion bombardment. The hydrocarbon gas in the chamber 8 is also bombarded by ions and begins to decompose to carbon and hydrogen, depositing elemental carbon on the hot substrate 10 and target 12. As more carbon is deposited simultaneously with the carbide compound on the substrate 10, a composition gradient develops through the coating such that the coating is richer in carbide compound near the substrate and richer in carbon near the exterior surface. When the partial pressure of acetylene is 0.034 Pa or greater and under the particular deposition conditions described above, the carbide sputter removal rate from the target 12 is less than the carbon accumulation rate on the target 12. As more elemental carbon is deposited onto the target 12 and more of the target surface is covered, less carbide compound will sputter onto the substrate 10. The carbide/carbon composition gradient of the deposited film will become even more pronounced. Finally, a continuous layer of elemental carbon forms on the target 12, and carbide deposition onto the substrate 10 ceases completely. A pure layer of elemental carbon then forms over the film on the substrate 10. It is this outer layer which has the high-emissivity characteristics desirable for thermoelectric generators. The carbide/carbon interface between the substrate and the outer carbon layer provides a strong bond which can withstand intense temperature and high vacuum conditions. This pure carbon layer, which does not form at lower partial pressures of acetylene, causes the sudden jump in emissivity seen in FIG. 2.

Figure 3:
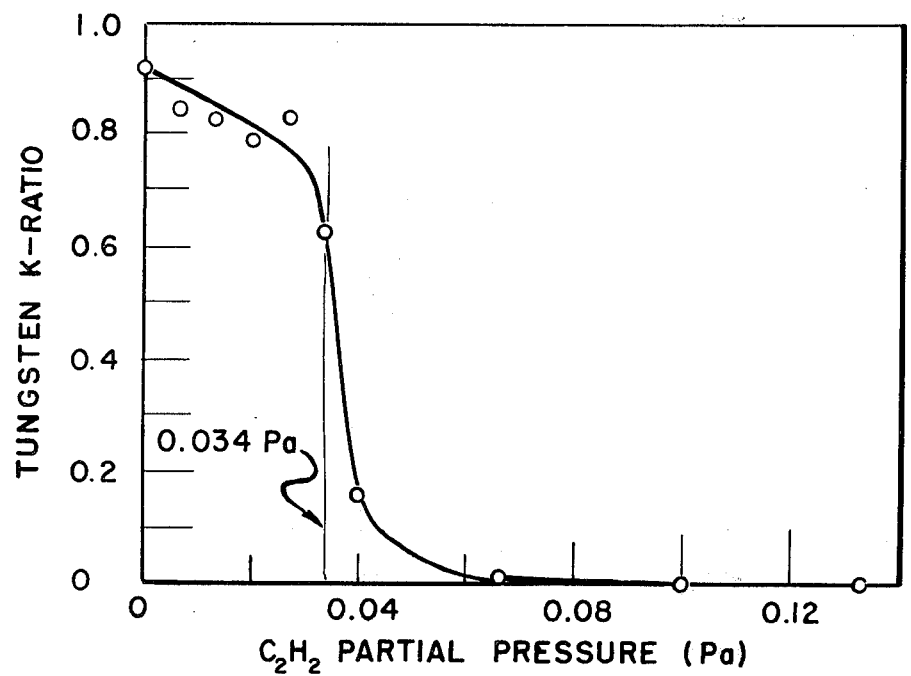
FIG. 3 is a graph of the tungsten K-ratio, a measure of the percent tungsten emissivity, as a function of the partial pressure of acetylene during deposition.

This change in film composition is illustrated in FIG. 3, which shows the tungsten K-ratios of the films as a function of the partial pressure of acetylene. This data is obtained from electron microprobe analysis of the tungsten-carbide/carbon films. The K-ratio in this case is the ratio of the background corrected film W $L_\alpha$ peak intensity to the W $L_\alpha$ peak intensity obtained from a pure tungsten standard. The K-ratio is thus a measure of the atomic concentration of tungsten in the film. FIG. 3 shows a steep decline in the curve when the partial pressure of acetylene is greater than 0.034 Pa indicating a sharp reduction in the amount of tungsten in the film. These findings are consistent with Auger electron spectroscopic analysis which indicate that the films deposited between 0.0 and 0.034 Pa acetylene partial pressure are tungsten rich and those deposited with acetylene partial pressure greater than 0.045 Pa are primarily carbon.

Figure 4:
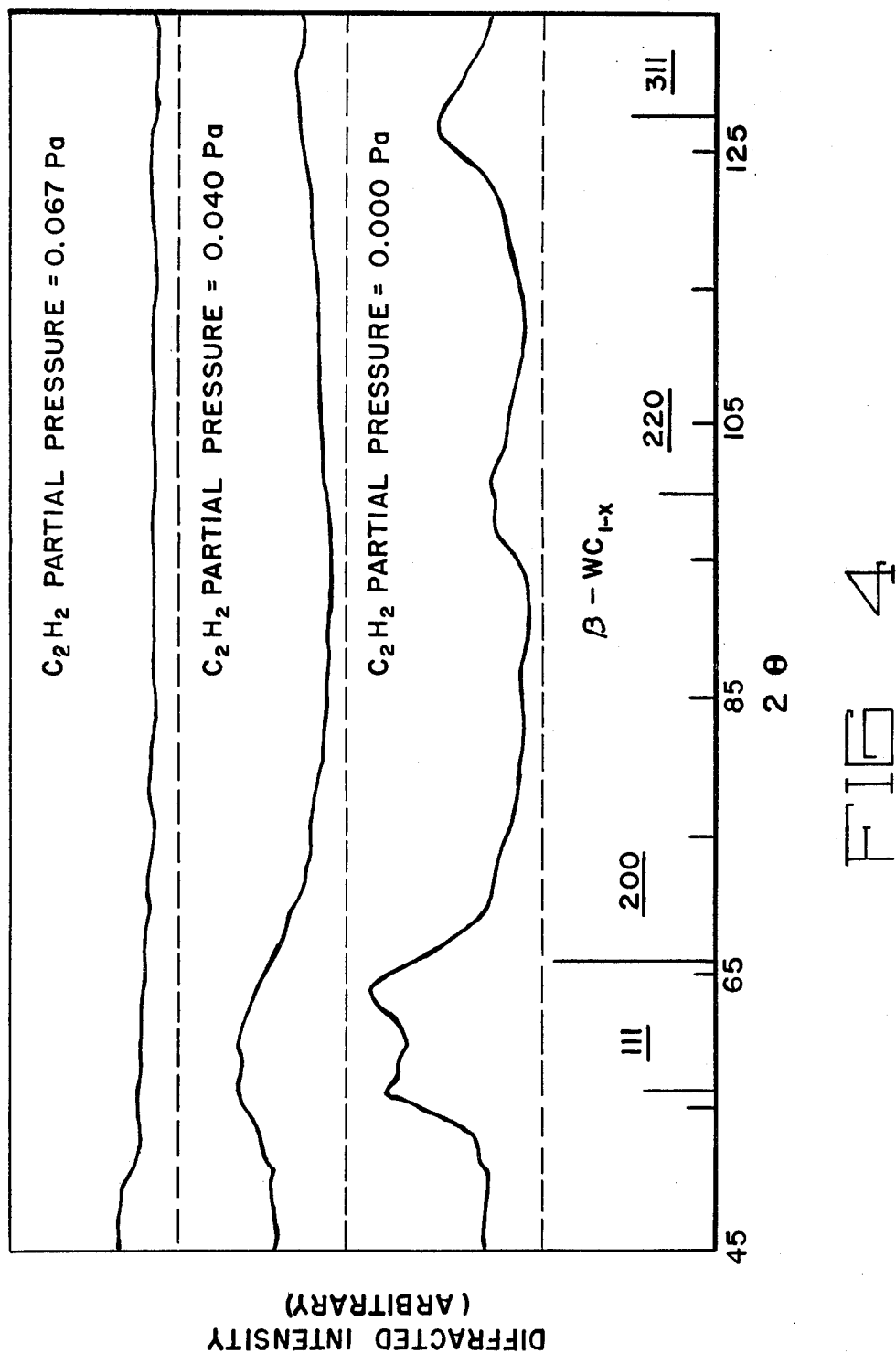
FIG. 4 shows the data from x-ray diffraction analysis of coatings desposited at various partial pressures of acetylene.

These findings are further supported by x-ray diffraction data shown in FIG. 4. In this Figure the diffracted intensity is plotted against the angle of diffraction $2\theta$. The vertical lines on the bottom graph show the location of the x-rays peaks for pure $\beta$—$WC_{1-x}$ standard. The three graphs above the standard are x-ray data for films produced at different partial pressures of acetylne. It can be seen that when no acetylene is used the film contains significant quantities of non-crystalline carbon and $\beta$—$WC_{1-x}$. As the acetylene partial pressure increases, percent of $\beta$—$WC_{1-x}$ decreases until, at partial pressures greater than 0.045 Pa, no $\beta$—$WC_{1-x}$ lines are detected.

Thus the subject invention is a unique combination of tungsten carbide sputter deposition and plasma assisted decomposition of acetylene by which adherent high emissivity layers of carbon can be formed. The foregoing description of a preferred embodiment is not intended to limit the invention to the precise form disclosed. Obviously, many modifications and variations are possible in light of the above teaching. For example, the substrate may be any suitable material. In addition to iridium, aluminum, and the carbon/carbon composite, materials such as iron and stainless steel should work equally well. The target may be made of tungsten carbide, but there is no reason why any group IVB-VIB metal or silicon or boron carbide should not work equally well. The main restriction is that the target and substrate materials be compatible with each other. Similarly, although these experiments were run with argon gas, any high atomic weight noble gas such as krypton or xenon would work as well. Acetylene is used for the hydrocarbon gas because it decomposes readily when struck with ions and because it has a high carbon-to-hydrogen ratio so there is not as much hydrogen to be pumped away after decomposition and carbon deposition. It is clear that any hydrocarbon gas could be used which would decompose to carbon and hydrogen when bombarded by ions. In addition, deposition parameters could be adjusted as needed to give desired results. The embodiment was chosen and described in order to best explain the principles of the invention and its practical application.

The embodiments of this invention in which an exclusive property or privilege is claimed are defined as follows:

1. A method for depositing a carbon layer on a substrate comprising:

providing a chamber for RF reactive sputter deposition, providing within the chamber a substrate and a target comprised of a carbide compound, providing a noble gas and a hydrocarbon gas to the chamber, applying RF power to the target to sputter deposit the carbide compound onto the substrate and to decompose the hydrocarbon gas to hydrogen and carbon such that carbon deposits on the target and substrate whereby a layer having a carbide/carbon composition gradient develops on the substrate, and maintaining the partial pressure of hydrocarbon gas sufficiently high so that the carbon accumulation rate on the target is greater than the sputter removal rate, whereby a continuous layer of carbon will form on the target and a layer of carbon will form over the carbide/carbon gradient on the substrate.

2. The method of claim 1 wherein the hydrocarbon gas is acetylene.

3. The method of claim 2 wherein the partial pressure of acetylene at least 0.034 Pa.

4. The method of claim 3 wherein the total pressure in the chamber is at least 3.33 Pa.

5. The method of claim 1 wherein the target is comprised of a carbide of at least one element selected from the group consisting of Si, B, Ti, Zr, Hf, V, Nb, Ta, Cr, Mo, and W.

6. The method of claim 5 wherein the target is comprised of tungsten carbide.

7. The method of claim 1 wherein the substrate material is selected from the group consisting of iridium, aluminum, carbon/carbon composite, iron, and stainless steel.

8. The method of claim 1 wherein the noble gas is selected from the group consisting of argon, krypton, and xenon.

* * * * *